United States Patent
Stark et al.

(10) Patent No.: US 9,547,049 B2
(45) Date of Patent: *Jan. 17, 2017

(54) AUTOMOTIVE MAGNETIC SHIELD

(71) Applicant: GM Global Technology Operations LLC, Detroit, MI (US)

(72) Inventors: David T. Stark, Superior Township, MI (US); Daniel J. Smith, Ypsilanti, MI (US); Thomas A. Perry, Bruce Township, MI (US); Joshua Charles Sautner, Buffalo Grove, IL (US)

(73) Assignee: GM Global Technology Operations, LLC, Detroit, MI (US)

( * ) Notice: Subject to any disclaimer, the term of this patent is extended or adjusted under 35 U.S.C. 154(b) by 71 days.

This patent is subject to a terminal disclaimer.

(21) Appl. No.: 14/258,736

(22) Filed: Apr. 22, 2014

(65) Prior Publication Data

US 2015/0301129 A1    Oct. 22, 2015

(51) Int. Cl.

| | |
|---|---|
| *G01R 33/00* | (2006.01) |
| *F16D 25/10* | (2006.01) |
| *F16D 25/12* | (2006.01) |
| *F16D 21/06* | (2006.01) |
| *G01D 5/14* | (2006.01) |
| *G01D 5/244* | (2006.01) |

(52) U.S. Cl.
CPC .......... *G01R 33/0076* (2013.01); *F16D 21/06* (2013.01); *G01D 5/145* (2013.01); *G01D 5/24433* (2013.01); *G01R 33/0047* (2013.01); *F16D 2300/18* (2013.01)

(58) Field of Classification Search
CPC .. F16D 21/06; F16D 2300/18; G01R 33/0047; G01R 33/0076
See application file for complete search history.

(56) References Cited

U.S. PATENT DOCUMENTS

| 4,805,466 A | 2/1989 | Schiessle et al. |
|---|---|---|
| 4,896,544 A | 1/1990 | Garshelis |
| 5,052,232 A | 10/1991 | Garshelis |
| 5,831,431 A | 11/1998 | Gottfried-Gottfried et al. |
| 5,889,215 A | 3/1999 | Kilmartin et al. |
| 6,330,833 B1 | 12/2001 | Opie et al. |
| 6,598,491 B2 | 7/2003 | Opie et al. |
| 8,266,977 B2 | 9/2012 | Mohlin et al. |
| 8,413,780 B2 | 4/2013 | Yildiz et al. |
| 8,459,135 B2 | 6/2013 | Singh et al. |
| 8,475,336 B2 | 7/2013 | Whitmarsh et al. |
| 8,485,333 B2 | 7/2013 | Hogberg et al. |
| 8,636,125 B2 | 1/2014 | Diemer et al. |
| 2006/0250029 A1 | 11/2006 | Kelly et al. |
| 2010/0191427 A1 | 7/2010 | Brammer et al. |

(Continued)

*Primary Examiner* — Richard Lorence (57) ABSTRACT

A linear magnetic sensor shield system comprises first and second shield parts. The system may include first and second field sensor assemblies, each having field sensors disposed therein. The first shield part may be disposed adjacent to a first side and a third side of the first field sensor assembly, and the second shield part may be disposed adjacent to a second side of the second field sensor assembly. The shield parts may be formed of mu metal, by of example, or they may have a curved shape or a thickness in the range of about 0.015 inch to about 0.030 inch. A torque transmitting device is also provided.

19 Claims, 9 Drawing Sheets

(56) References Cited

U.S. PATENT DOCUMENTS

| | | | |
|---|---|---|---|
| 2011/0139571 A1* | 6/2011 | Acker et al. | F16D 21/06 |
| | | | 192/85.01 |
| 2011/0303085 A1 | 12/2011 | Heurich et al. | |
| 2012/0146625 A1* | 6/2012 | Grommer et al. | F16D 25/083 |
| | | | 324/207.12 |
| 2012/0249128 A1 | 10/2012 | Zhou et al. | |
| 2013/0141082 A1 | 6/2013 | Zhou et al. | |
| 2014/0084905 A1* | 3/2014 | Shestakov | G01R 33/072 |
| | | | 324/207.12 |
| 2015/0301130 A1* | 10/2015 | Stark | G01R 33/0076 |
| | | | 192/48.8 |

\* cited by examiner

AUTOMOTIVE MAGNETIC SHIELD

FIELD

The present disclosure relates to magnetic sensor systems, and more particularly, to a shield system for a magnetic sensor system in automotive applications.

BACKGROUND

The statements in this section merely provide background information related to the present disclosure and may or may not constitute prior art.

Transmissions and other powertrain components in automotive vehicles are complex mechanisms controlled by hydraulic systems and electronic control modules. In order to provide proper control, it is desirable to have feedback on the operating conditions and performance of the transmission as the transmission operates. For example, transmissions typically include a plurality of sensors that communicate information indicative of the operating state of the transmission to the electronic controller. These sensors take many forms and perform various functions. For example, it is often desirable to determine the engagement condition of a torque transmitting device, such as the clutches used in a dual clutch transmission. Accordingly, one or more linear displacement sensors are used to measure the reactive position of the clutches in order to determine engagement state. Often these sensor use magnetic fields and magnetic field transducers to produce an output voltage without contact to the mechanical element they are measuring.

However, in certain environments, it is possible that other nearby components may give off magnetic flux that causes the sensors to incorrectly measure the flux emitted from the intended magnet. While current linear displacement sensors are useful for their intended purpose, there is room in the art for an improved linear displacement sensor system that reduces or eliminates magnetic flux interference in areas of a transmission where various components may exhibit magnetism.

SUMMARY

A linear sensor shield system is configured to shield magnetic flux from extraneous automotive components so that flux from intended magnets may be accurately measured. A member having high magnetic permeability may be disposed adjacent to each sensor to absorb external magnetic flux.

In one form, which may be combined with or separate from the other forms described herein, a linear sensor shield system is provided, which includes first and second field sensor assemblies and a shield system. The first field sensor assembly has a first assembly housing, and the first assembly housing has a first side and a third side extending from the first side. The first field sensor assembly has first and second field sensors spaced a distance apart from each other, wherein the first and second field sensors are disposed in the first assembly housing. The second field sensor assembly has a second assembly housing, and the second assembly housing has a second side. The second field sensor assembly has third and fourth field sensors spaced a distance apart from each other, wherein the third and fourth field sensors are disposed in the second assembly housing. The second field sensor assembly is disposed adjacent to the first field sensor assembly. The shield system is disposed adjacent to the first and second field sensor assemblies. The shield system has a first shield part disposed adjacent to the first side and the third side, and shield system also has a second shield part disposed adjacent to the second side. Each field sensor assembly may have its own target magnet attached to the mechanical element whose position is to be measured. The use of two field sensors in each of the field sensor assemblies may create a differential measurement of the respective target magnet field.

In another form, which may be combined with or separate from the other forms described herein, a linear sensor shield system is provided. The linear sensor shield system includes a first field sensor assembly having a first assembly housing. The first assembly housing has a first side. The first field sensor assembly includes first and second field sensors spaced a distance apart from each other. The first and second field sensors are disposed in the first assembly housing. The linear sensor shield system also includes a second field sensor assembly having a second assembly housing. The second assembly housing has a second side. The second field sensor assembly includes third and fourth field sensors spaced a distance apart from each other. The third and fourth field sensors are disposed in the second assembly housing. The second field sensor assembly is disposed adjacent to the first field sensor assembly. A shield system is disposed adjacent to the first and second field sensor assemblies. The shield system includes a first shield part disposed adjacent to the first side and a second shield part disposed adjacent to the second side. The first shield part has a thickness in the range of about 0.015 inch to about 0.030 inch, and the second shield part has a thickness in the range of about 0.015 inch to about 0.030 inch.

In yet another form, which may be combined with or separate from the other forms described herein, a linear sensor shield system for use in an automobile is provided. The linear sensor shield system includes a first shield having a thickness in the range of about 0.015 inch and about 0.030 inch, wherein the first shield is configured to be disposed adjacent to a first field sensor assembly. The linear sensor shield system also includes a second shield having a thickness in the range of about 0.015 inch and about 0.030 inch, wherein the first and second shields are disposed a distance apart from each other.

In still another form, which may be combined with or separate from the other forms described herein, a linear sensor shield system for use in an automobile is provided. The linear sensor shield system includes a first shield configured to be disposed adjacent to a first field sensor assembly. The first shield has a first shield first portion and a first shield second portion. The first shield first portion is generally planar, and the first shield second portion is generally planar. The first shield second portion is disposed generally perpendicularly with respect to the first shield first portion. The first shield first portion and the first shield second portion are unitarily formed with each other. The linear sensor shield system also includes a second shield configured to be disposed adjacent to a second field sensor assembly. The second shield has a second shield first portion and a second shield second portion. The second shield first portion is generally planar, and the second shield second portion is generally planar. The second shield second portion is disposed generally perpendicularly with respect to the second shield first portion. The second shield first portion and the second shield second portion are unitarily formed with each other. The first and second shields are disposed a distance apart from each other.

In still another form, which may be combined with or separate from the other forms described herein, a torque transmitting device for an automotive transmission is provided. The torque transmitting device includes an input member, a first input shaft, and a second input shaft. The first input shaft has a first shaft magnetic permeability, and the second input shaft has a second shaft magnetic permeability. A first clutch assembly selectively connects the first input shaft with the input member, and a second clutch assembly selectively connects the second input shaft with the input member. A first actuating member has a first main body and a first permanent magnet attached to the first main body. The first actuating member is configured to move in a linear direction to actuate the first clutch assembly to connect the input member to the first input shaft. A second actuating member has a second main body and a second permanent magnet attached to the second main body. The second actuating member is configured to move in a linear direction to actuate the second clutch assembly to connect the input member to the second input shaft. A sensor system includes a first field sensor assembly, a second field sensory assembly, and a shield system. The first field sensor assembly has a first assembly housing, and the first assembly housing has a first side and a third side disposed adjacent to the first side. The first field sensor assembly includes first and second field sensors spaced a distance apart from each other. The first and second field sensors are disposed in the first assembly housing. The second field sensor assembly has a second assembly housing, and the second assembly housing having a second side. The second field sensor assembly includes third and fourth field sensors spaced a distance apart from each other. The third and fourth field sensors are disposed in the second assembly housing. The second field sensor assembly is disposed adjacent to the first field sensor assembly. The shield system is disposed adjacent to the first and second field sensor assemblies. The shield system includes a first shield part disposed adjacent to the first side and the third side, and a second shield part disposed adjacent to the second side.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1A:
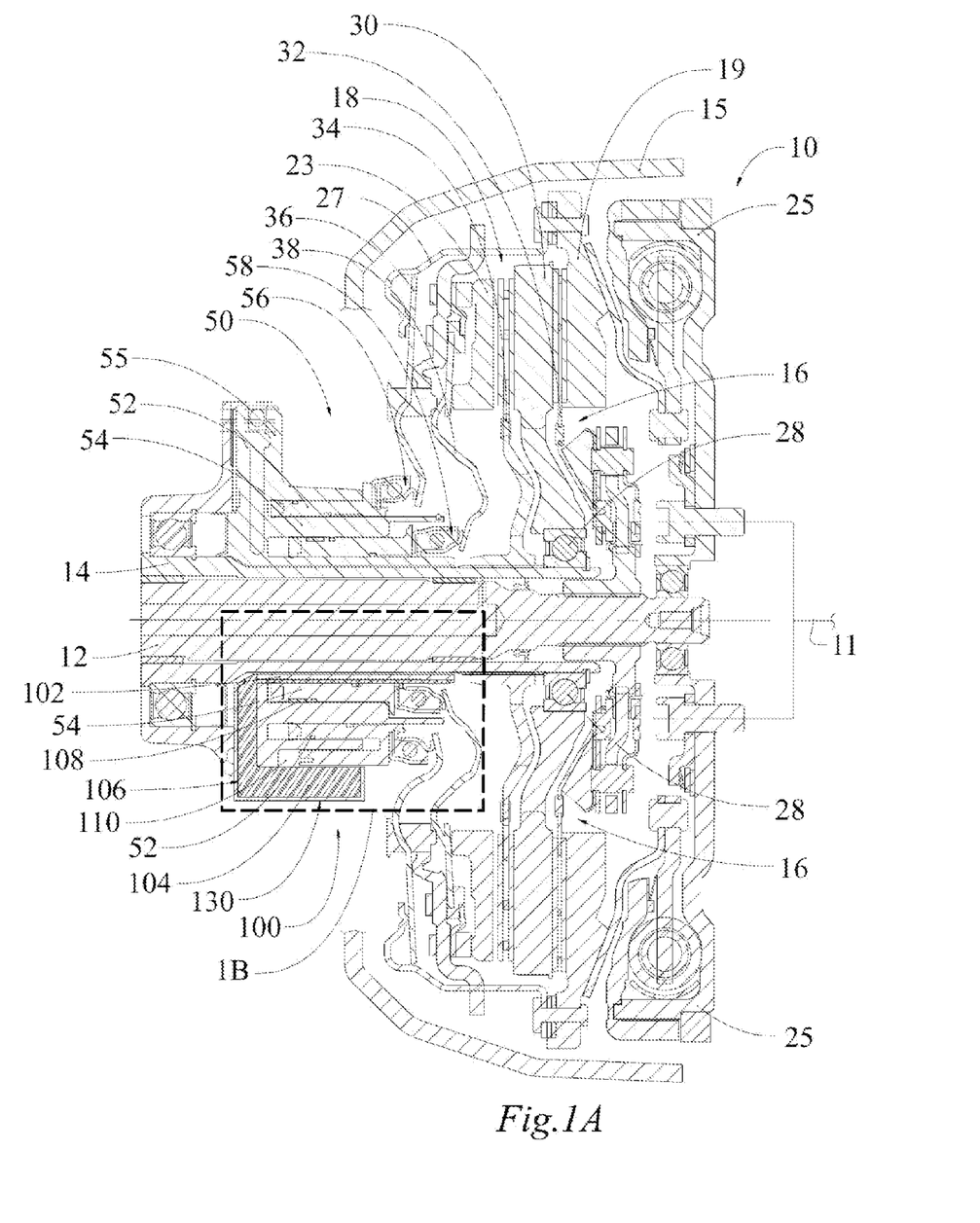
FIG. 1A is a cross-sectional view of a portion of an exemplary dual clutch transmission showing an exemplary dual clutch actuation system, according to the principles of the present disclosure.

With reference to FIG, 1, a torque transmitting device for a dual input transmission (not shown) is generally indicated by reference number 10. The torque transmitting device 10 is for example a dual clutch disposed in a vehicle powertrain. Typically the vehicle powertrain includes an engine and a transmission. In the instant embodiment, the transmission is a dual input transmission where torque is transferred from the engine via an input member, such as a crankshaft 11, to two input shafts in the transmission including a first input shaft 12 and a second input shaft 14 through selective operation of the torque transmitting device 10. The second input shaft 14 is a sleeve (or hollow) shaft that is concentric with and overlies the first input shaft 12. The torque transmitting device 10 is disposed in a transmission housing or bell housing 15.

The torque transmitting device 10 has two separate and independent friction clutches 16 and 18, a portion of which are rotationally fixed to a flywheel 25. The flywheel 25 is rotationally fixed to the crankshaft 11 and is preferably a dual mass flywheel that is configured to dampen and reduce vibration in the crankshaft 11.

The friction clutches 16 and 18 each include friction members 32 and 34, respectively. The friction member 32 is connected to the input shaft 12. The friction member 34 is connected to the sleeve shaft 14. A center plate 30 is supported by a bearing 28 and friction elements 19, 23 that are attached and rotationally fixed to the flywheel 25 through a clutch assembly cover 27. The friction elements 19, 23 are disposed on either side of the center plate 30, with the first friction member 32 disposed between the first friction element 19 and the center plate 30 and the second friction member 34 disposed between the second friction element 23 and the center plate 30.

The friction elements 19, 23 and friction members 32, 34 form the dual friction clutches 16, 18. Selective engagement of the first friction dement 19 and the first friction member 32 through axial compression connects the inner input shaft 12 with the flywheel 25 and the crankshaft 11, and selective engagement of the second friction element 23 with the second friction member 34 through axial compression connects the sleeve input shaft 14 with the flywheel 25 and the crankshaft 11.

The coupling of the crankshaft 11 to the input shafts 12, 14 is achieved through axially moveable apply members 36 and 38, respectively. The apply members 36 and 38 are each selectively translatable in an axial direction to engage one of the friction members 32 and 34 in order to couple the crankshaft 11 with one of the input shafts 12 and 14. The apply members 36 and 38 are selectively actuated by a lever actuation assembly 50.

The lever actuation assembly 50 includes a pair of annular pistons 52 and 54 disposed in a cylinder housing 55. The pistons 52, 54 are generally non-magnetic. The cylinder housing 55 is rotationally fixed relative to the transmission. Annular bearing assemblies 56 and 58 are each connected with ends of the annular pistons 52 and 54, respectively. The annular pistons 52 and 54 are configured to translate within the cylinder housing 55 when actuated by hydraulic fluid. The annular pistons 52 and 54 and the annular bearings 56 and 58 are radially aligned such that the annular piston 52 and the annular bearing 56 are engageable with the apply member 36 to selectively engage the first clutch 16 and the annular piston 54 and annular bearing 58 are engageable with the apply member 38 to selectively engage the second clutch 18. The bearing assemblies 56 and 58 are actuation bearings that torsionally decouple the rotating elements of the dual clutch 10 (i.e. the first and second members 36 and 38) from the non-rotating members of the actuation device 50 (i.e. the pistons 52 and 54).

The torque transmitting device 10 further includes a clutch actuation sensor assembly 100 operable to sense the engagement of the clutches 16 and 18 by sensing the linear displacement of the pistons 52 and 54. The sensor assembly 100 includes an inner permanent magnetic linear contactless displacement (PLCD) sensor 102 and an outer PLCD sensor 104. The PLCD sensors 102, 104 are disposed within a sensor housing 106. The sensor housing 106 is coupled to the cylinder housing 55 and is configured to position the PLCD sensors 102, 104 proximate to an inner permanent magnet 108 and an outer permanent magnet 110, respectively. The inner magnet 108 is coupled to the annular piston 54 and the outer magnet 110 is coupled to the annular piston 52. The PLCD sensors 102, 104 are operable to detect a magnetic field induced by the magnetic flux of the magnets 108, 110 as they are displaced by translation of the annular pistons 52 and 54. Magnets 108 and 110 are poled perpendicular to one another, and magnetic field sense elements 112 and 114 for each of the sensors 102, 104 are oriented with their field sense direction parallel to their respective magnets to minimize cross talk between PLCD 102 and PLCD 104. A flux concentrating element 120 is included between magnetic field sense elements 112 and 114 on PLCD 102.

A shield system 130 is provided to shield the PLCD sensors 102, 104 from outside magnetic fields, in other words, magnetic fields not originating with the magnets 108, 110. The shield system 130 includes a first shield part 132 and a second shield part 134, which will be described in more detail below.

Figure 2:
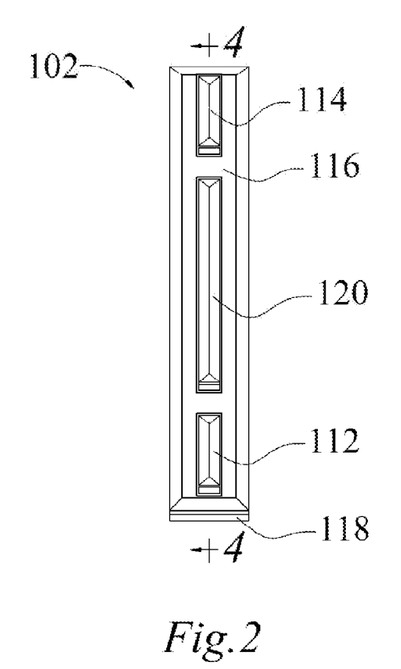
FIG. 2 is a top view of a PLCD sensor of the field sensor assembly of FIGS. 1A-1B, according to the principles of the present disclosure.
Figure 3:
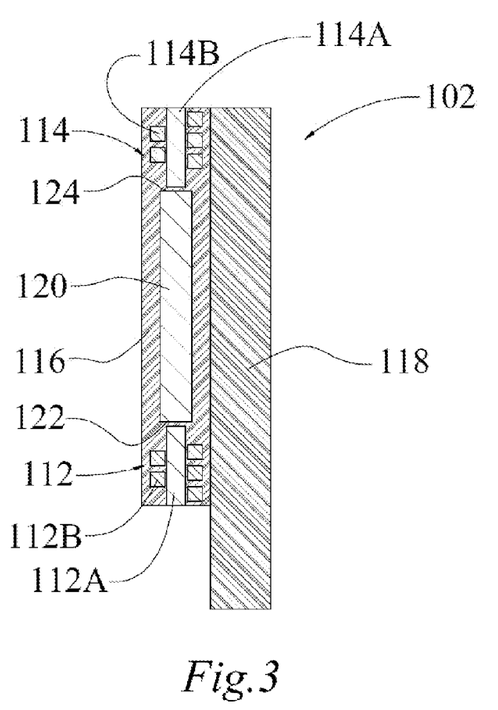
FIG. 3 is a cross-sectional view of the PLCD sensor shown in FIG. 2, in accordance with the principles of the present disclosure.

Turning to FIGS. 2 and 3, the PLCD sensors 102 and 104 will now be described. As both sensors function similarly in this embodiment, reference will be made to the inner PLCD sensor 102 with the understanding that the description provided herein is applicable to the outer PLCD sensor 104. The PLCD sensor 102 includes a first field sensor 112 and a second field sensor 114. The first field sensor 112 includes a magnetic core 112A surrounded by a coil 112B. Likewise, the second field sensor 114 includes a magnetic dare 114A surrounded by a coil 114B. Both field sensors 112 and 114 are supported in a non-magnetic insulative material 116 that is attached to a substrate or backing 118. The non-magnetic insulative material 116 could be a plastic, such as printed circuit board (PCB), by way of example. The first field sensor 112 is spaced axially apart and away from the second field sensor 114. A flux conducting member 120 aligned with the magnetic cores 112A, 114A may be disposed between the first and second field sensors 112, 114 within the non-magnetic insulative material 116.

Figure 4:
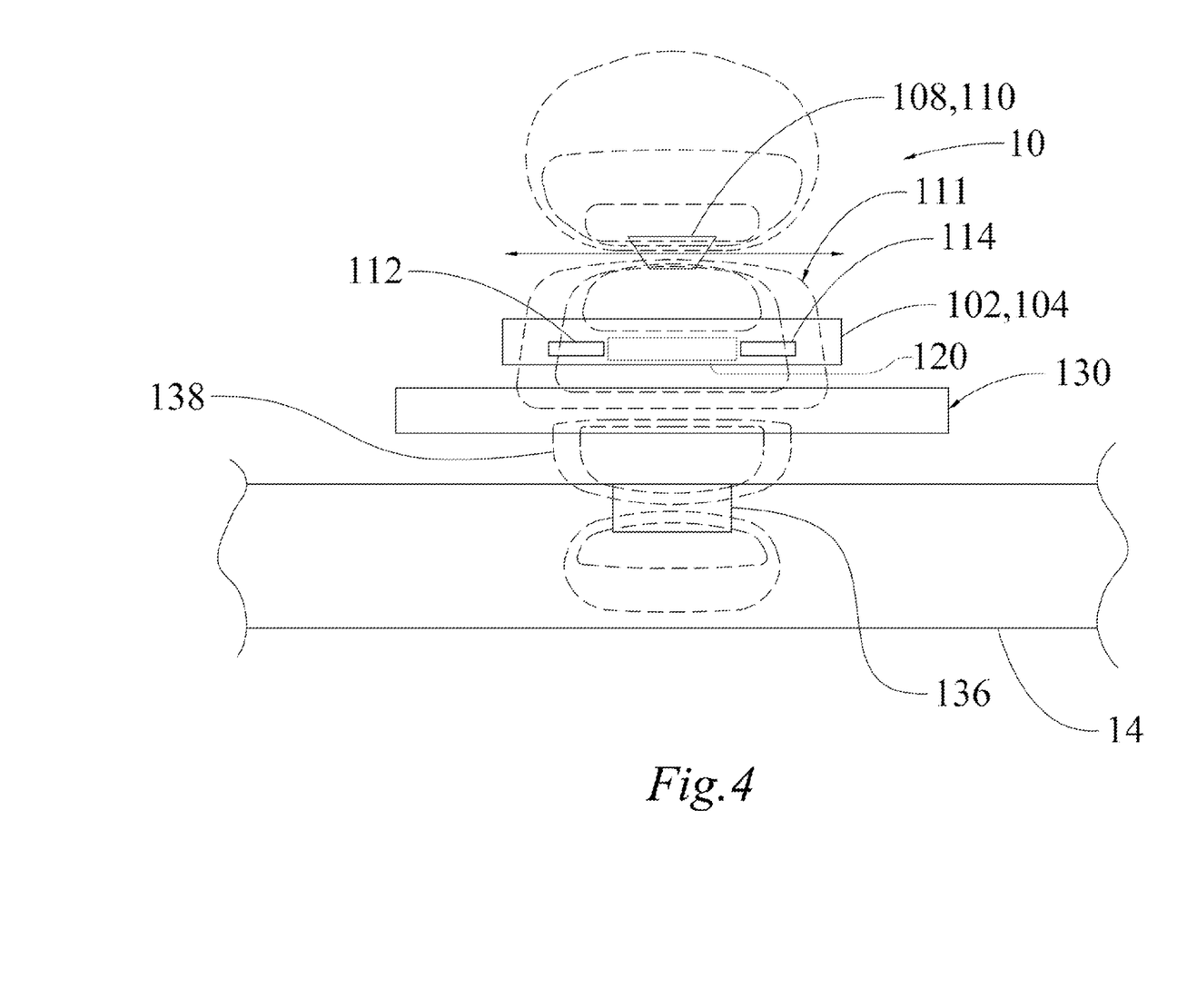
FIG. 4 is a schematic side view of a portion of the powertrain and the field sensor assembly system of FIGS. 1A-3, having a first version of a shield system, according to the principles of the present disclosure.

Referring now to FIG. 4, the flux within the torque transmitting device 10 is schematically Illustrated. The sensor magnets 108, 110 give off a magnetic field 111, which may be detected by the field sensors 112, 114 of one of the PLCD sensors 102, 104. Other parts of the torque transmitting device 10 may also create a magnetic field, such as the sleeve shaft 14. This magnetization is unwanted and interferes with the desired position sensing capabilities of PLCD 102 and 104. For example, the sleeve shaft 14 may have a magnetic hot spot 136 that creates an outside magnetic field 138. The shield system 130, including one or more of the shield parts 132, 134 designed to redirect the outside magnetic field 138 created by the hot spot 136 of the sleeve shaft 14 or other magnetized part, so that the outside magnetic field 138 is not detected by the PLCD sensors 102, 104.

Figure 1B:
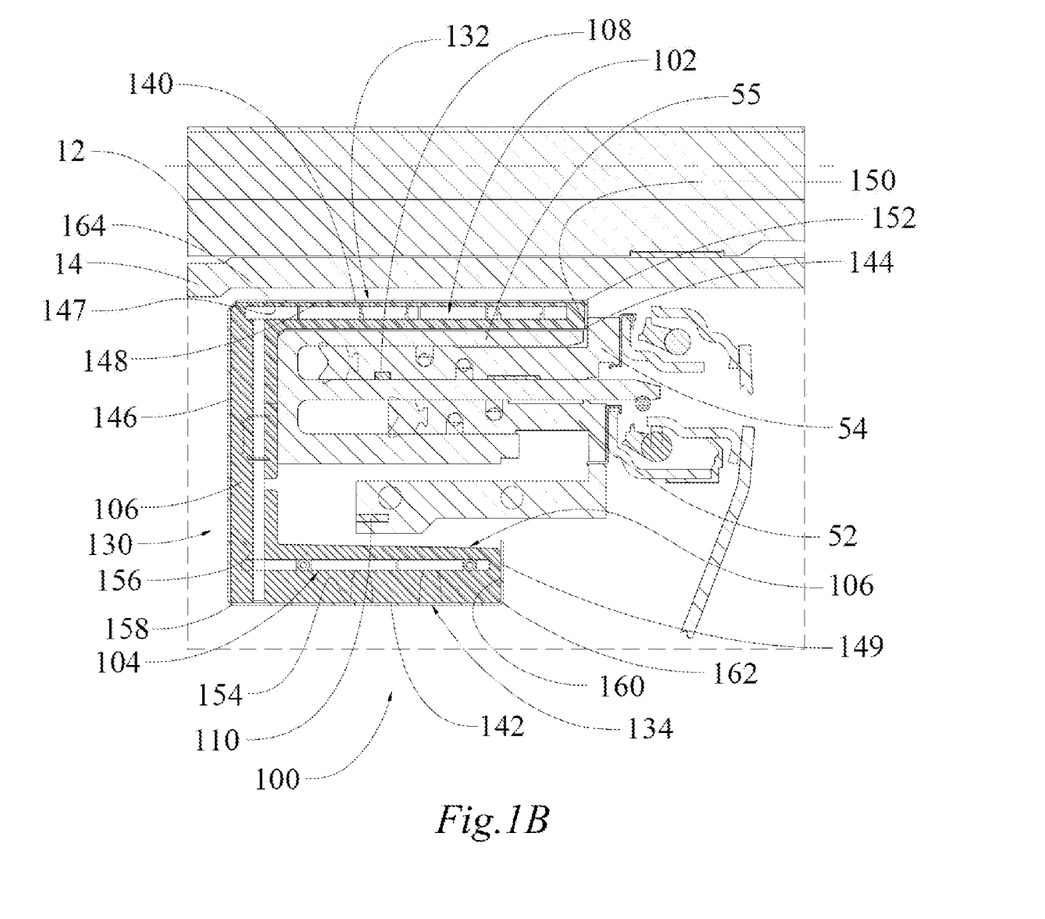
FIG. 1B is a cross-sectional view of a portion of the dual clutch transmission of FIG. 1A, taken along the box 1B in FIG. 1A, zoomed in to focus on a field sensor assembly system, in accordance with the principles of the present disclosure.

Referring now to FIG. 1B, the first sensor assembly 102 has a first side 140 and a third side 144 extending at about a ninety-degree angle from the first side 140. The second field sensor assembly 104 has a second side 142 and a fourth side 146 extending at about a ninety-degree angle from both the first side 140 and the second side 142. The first, second, third, and fourth sides 140, 142, 144, 146 refer to the sides of the sensor assemblies 102, 104 themselves, prior to the addition of the shield system 130 along the edges of the sensor assemblies 102, 104. The fourth side 146 connects the first and second sides 140, 142, the first and second sides 140, 142 being parallel to each other. The first and second field sensor assemblies 102, 104 are connected together in this example, and their housing 106 may be formed together as illustrated in FIG. 1B. A chamfered corner 147 is disposed between the first and fourth sides 140, 146. A fifth side 149 is disposed adjacent to the second side 142, at about a ninety-degree angle from the second side 142.

Referring now to FIGS. 1B, 5A, 5B, 6A, and 6B, the shield system 130 is shown and described in detail. In the illustrated example, the first shield part 132 has a first segment 148 that is disposed adjacent to and in contact with the first side 140 of the first field sensor assembly 102. The first shield part 132 also has a third segment 150, the third segment 150 being disposed adjacent to and in contact with the third side 144 of the first sensor assembly 102. Accordingly, the first shield part 132 has about a ninety-degree first bend 152 in the first shield part 132, the first bend 152 connecting the first and third segments 148, 150. Thus, the third segment 150 extends generally perpendicularly from and with respect to the first segment 148. Accordingly, the first shield part 132 is disposed along the outer edges of the first field sensor assembly 102 when the shield part 132 is assembled therewith.

The second shield part 134 has a second segment 154 that is disposed adjacent to and contact the second side 142 of the second field sensor assembly 104. The second shield part 134 also has a fourth segment 156, the fourth segment 156 being disposed adjacent to and in contact with the fourth side 146 of the second field sensor assembly 104. Accordingly, the second shield part 134 has about a ninety-degree second bend 158 in the second shield part 134, the second bend 158 connecting the second and fourth segments 154, 156. Thus, the fourth segment 156 extends generally perpendicularly from and with respect to the second segment 154.

Figure 5A:
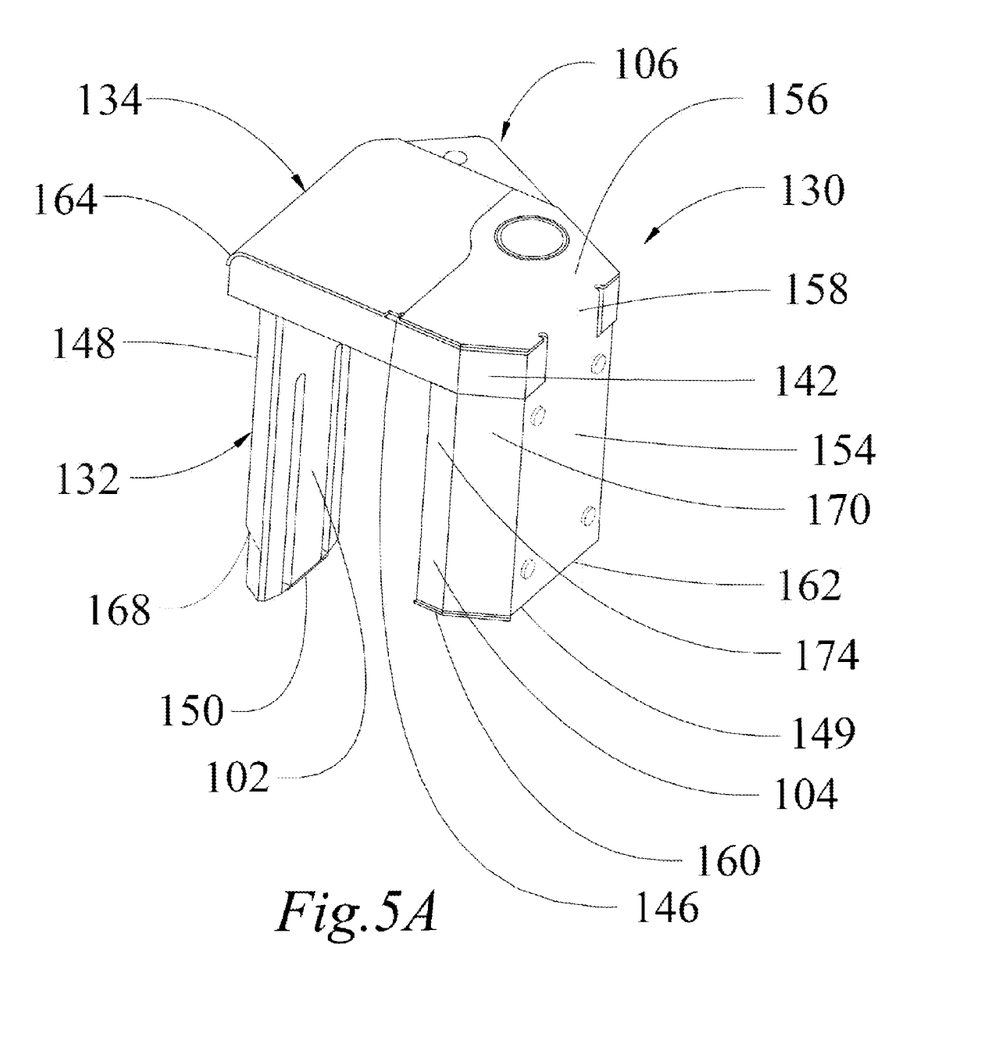
FIG. 5A is a perspective view of a first side of the field sensor assembly shown in FIGS. 1A-4, in accordance with the principles of the present disclosure.
Figure 5B:
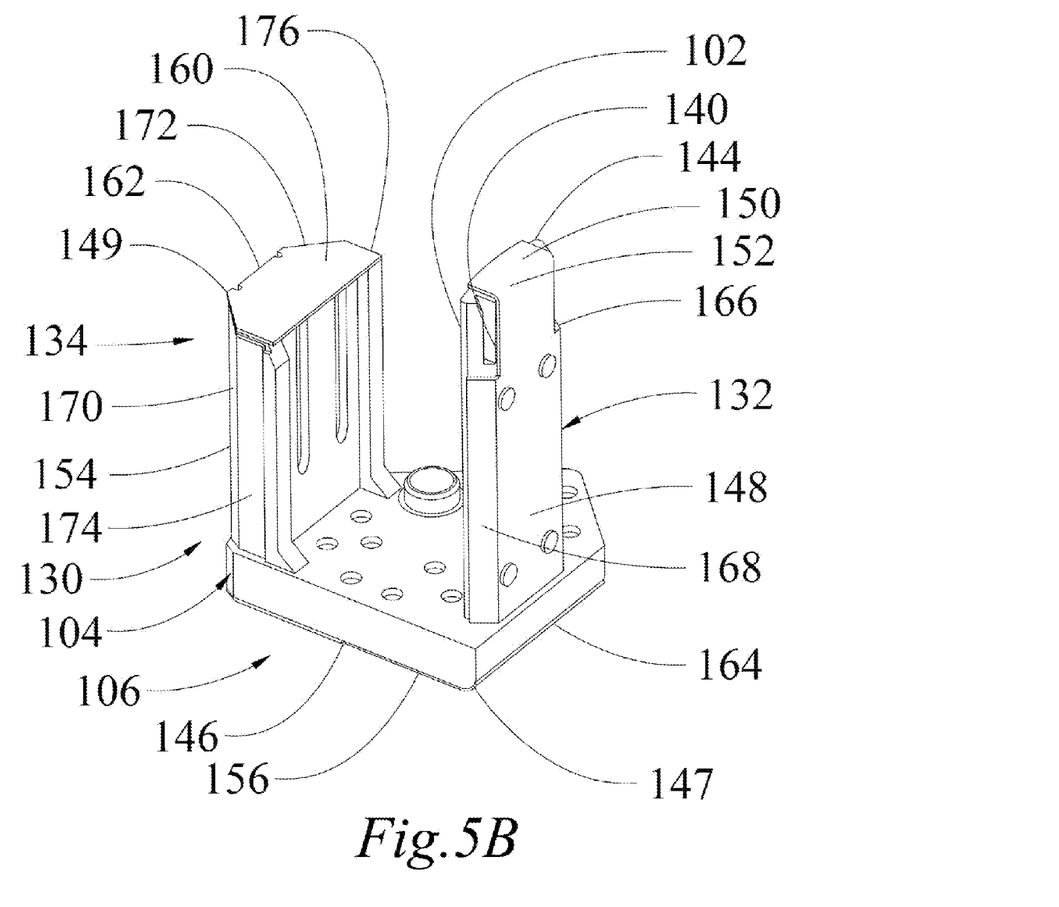
FIG. 5B is a perspective view of a second side of the field sensor assembly shown in FIGS. 1A-5A, according to the principles of the present disclosure.
Figure 6A:
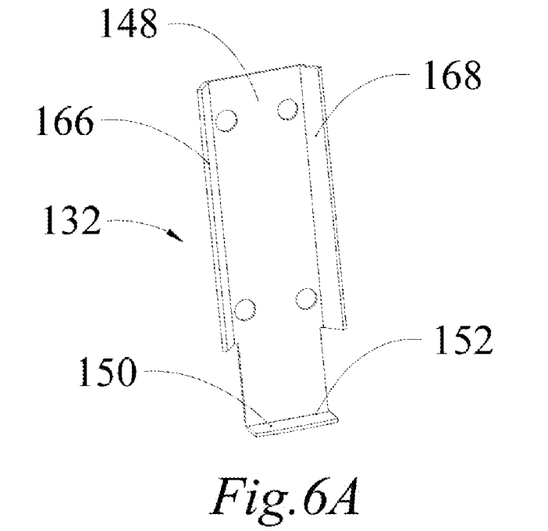
FIG. 6A is a perspective view a first shield part of the field sensor assembly shown in FIGS, 1A-5B, in accordance with the principles of the present disclosure.
Figure 6B:
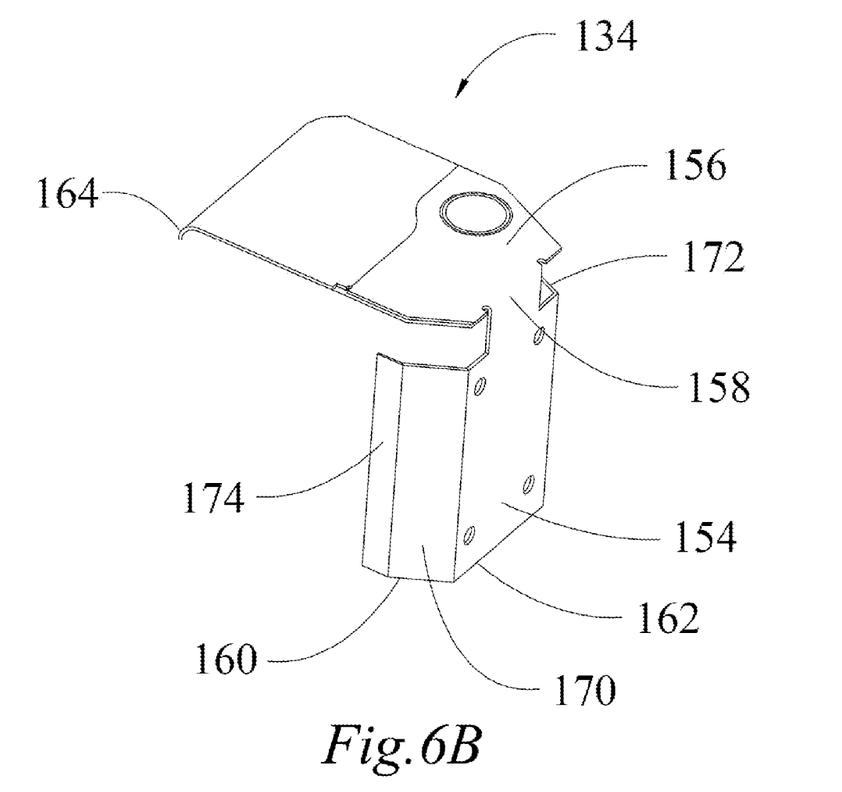
FIG. 6B is a perspective view of a second shield part of the field sensor assembly shown in FIGS. 1A-5B, according to the principles of the present disclosure.

A fifth segment 160 of the second shield part 134 is disposed adjacent to and contacting the fifth side 149 of the second field sensor assembly 104. The second shield part 134 has about a ninety-degree third bend 162 in the second shield part 134, the third bend 162 connecting the second segment 154 and the fifth segment 160. Thus, the fifth segment 160 extends generally perpendicularly from and with respect to the second segment 154. The fourth and fifth segments 156, 160 are generally parallel to each other. A sixth segment 164 of the second shield part 134 extends from the fourth segment 156 at about a 135° angle, the sixth segment 164 contacting the chamfered corner 147. Accordingly, the second shield part 134 is disposed along the outer edges of the second field sensor assembly 104 when the shield part 134 is assembled therewith.

In the illustrated embodiment, the first and second shield parts 132, 134 are spaced a distance apart from each other and not contacting each other. However, in another embodiment, the first and second shield parts 132, 134 could be connected to each other and/or unitarily formed as one piece. Furthermore, the first and third segments 148, 150 of the first shield part 132 are unitarily formed as one piece in the illustrated embodiment, however, in another embodiment, the first and third segments 148, 150 could be formed of two connected parts, or of two parts that are disconnected from each other. Likewise, the second, fourth, fifth, and sixth segments 154, 156, 160, 164 are illustrated as being unitarily formed as one piece, however, in another embodiment, each of the second, fourth, fifth, and sixth segments 154, 156, 160, 164 could be formed of connected parts, or disconnected parts, or some connected and some disconnected parts. Furthermore, one or more of the first, second, third, fourth, fifth, and sixth segments 148, 150, 154, 156, 160, 164 could be omitted, in certain embodiments, if desired. Each segment 148, 150, 154, 156, 160, 164 is illustrated as being generally flat and planar, however, other configurations could be used, if desired.

The first and second shield parts 132, 134 may also have additional features, if desired. For example, the first shield part 132 may have seventh and eighth planar segments 166, 168 extending from the first segment, for example, at about 135° angles, if desired, to shield additional parts of the first field sensor assembly 102. Similarly, the second shield part 134 may have ninth and tenth planar segments 170, 172 extending, for example, at about 135° angles, from the second segment 154. Further, the second shield part 134 may have eleventh and twelfth planar segments 174, 176 extending at, for example, 135° angles from the ninth and tenth segments 170, 172, respectively. Thus, the eleventh and twelfth segments 174, 176 may be disposed generally perpendicularly with respect to the second segment 154, the first segment 148, and the fourth segment 156, as illustrated in FIGS. 5A, 5B, and 6B.

In some variations, the first and second shield parts 132, 134 may each have thicknesses in the ranges of about 0.015 inch to about 0.030 inch. In other words, each segment 148, 150, 154, 156, 160, 164, 166, 168, 170, 172, 174, 176 may have a thickness in the range of about 0.015 inch to about 0.030 inch, by way of example. Material may have a maximum coercivity of 2 Oerstad, or 160 A/m.

In some variations, the first and second shield parts 132, 134 may be formed of a material having a higher magnetic permeability than 5120 steel. In some forms, the first and second shield parts 132, 134 may be formed of a material having a relative magnetic permeability of at least 80,000. In some examples, the first and second shield parts 132, 134 may be formed partly or entirely of mu metal. Mu metal may contain about 77% nickel, about 16% iron, about 5% copper, and about 2% of either chromium or molybdenum. In FIGS. 1-6B, the first and second shield parts 132, 134 are shown being formed entirely of mu metal.

Figure 7:
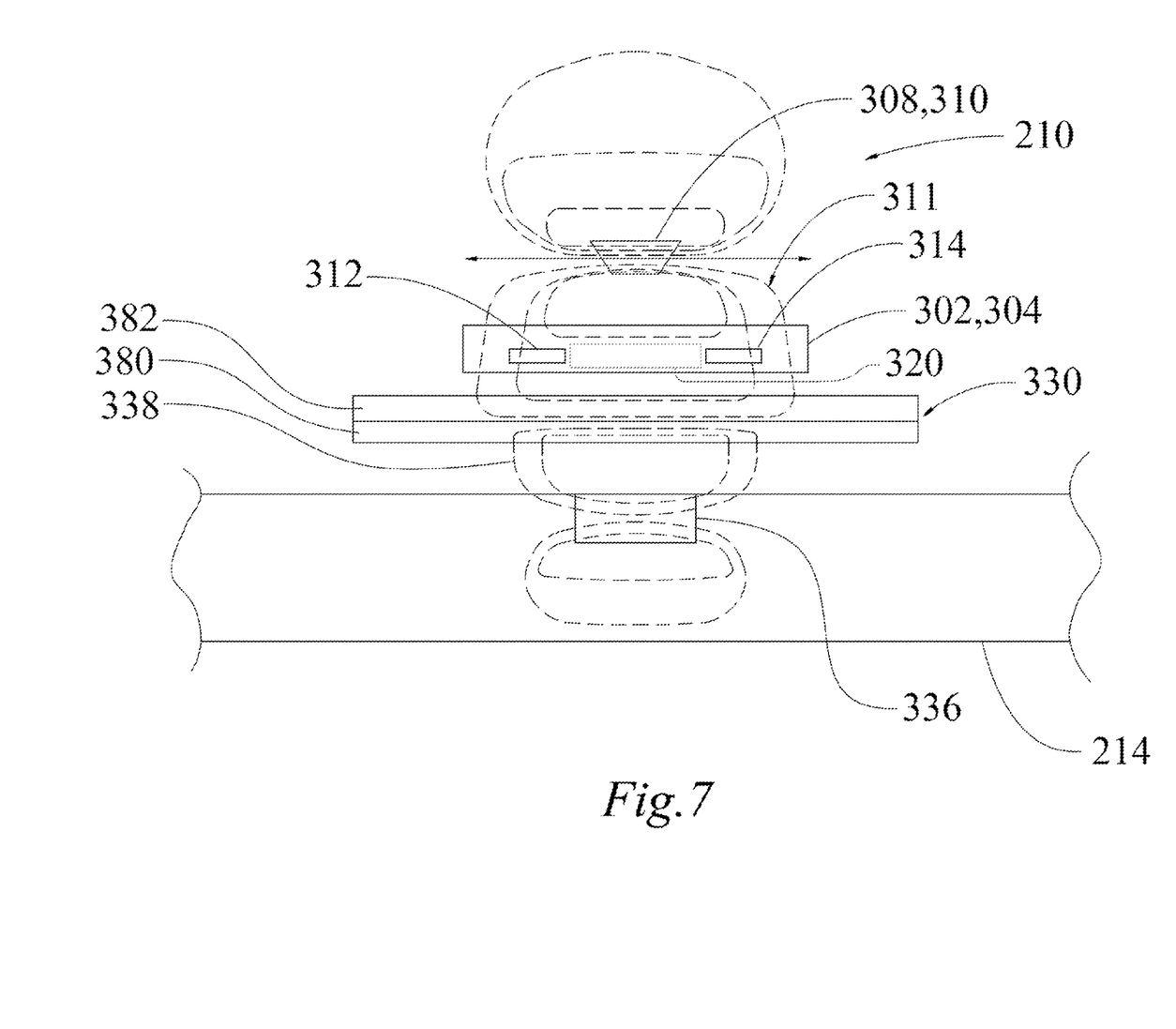
FIG. 7 is a schematic side view of a portion of the powertrain and the field sensor assembly system of FIGS. 1A-3, having a second version of a shield system, according to the principles of the present disclosure.

Referring now to FIG. 7, another example of flux within a torque transmitting device 210 is illustrated having a magnetic sleeve shaft 214 and first and second field sensors 312, 314 of a PLCD sensor 302, 304. Each of the torque transmitting device 210, the fields sensors 312, 314 and PLCD sensor 302, 304 may be the same as those described above in FIGS. 1-5B. For example, a flux concentrating element 320 is disposed between the field sensors 312, 314. The only difference in FIG. 7 is the shield system 330.

Like the sensor magnets 108, 110 described above, sensor magnets 308, 310 give off a magnetic field 311, which may be detected by the field sensors 312, 314 of one of the PLCD sensors 302, 304. However, other parts of the torque transmitting device 210 may also create a magnetic field, such as the sleeve shaft 214. For example, the sleeve shaft 214 may have a magnetic hot spot 336 that creates an outside magnetic field 338. The shield system 330, including one or more of the shield parts 332, 334 may redirect the outside magnetic field 338 created by the hot spot 336 of the sleeve shaft 214 or other magnetized part, so that the outside magnetic field 338 is not detected by the PLCD sensors 302, 304.

In FIG. 7, the shield system 330 includes a composite shield having a first layer 380 formed of mu metal and a second layer 382 formed of steel, such as 1010, 1008, or 1018 steel, by way of example. The thickness of both layers 380, 382 together could be in the range of about 0.015 inch to about 0.030 inch, by way of example. In some forms, the mu metal layer 380 could comprise about 25% of the thickness both layers 380, 382 together. In some examples, the mu metal layer 380 could have a thickness in the range of about 0.002 inch to about 0.125 inch. For example, the mu metal layer 380 could have a thickness of about 0.002 inch, about 0.004 inch, about 0.006 inch, about 0.008 inch, about 0.010 inch, about 0.014 inch, about 0.020 inch, about 0.025 inch, about 0.030 inch, about 0.040 inch, about 0.050 inch, about 0.062 inch, about 0.095 inch, or about 0.125 inch. The mu metal is present for permeability properties and steel provides a higher saturation magnetization.

Figure 8:
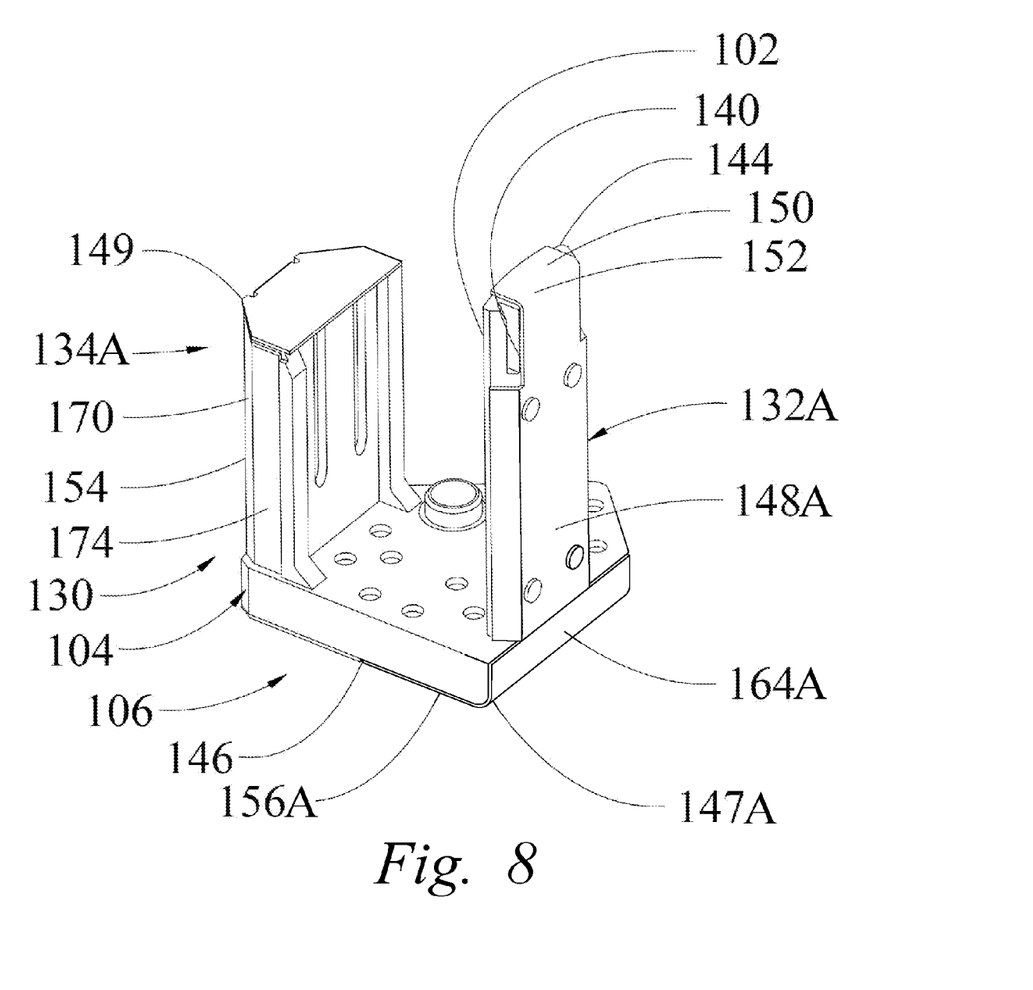
FIG. 8 is a perspective view of a second side of the field sensor assembly modified from FIG. 5B, according to the principles of the present disclosure.

Referring to FIG. 8, a further embodiment is modified from the embodiment shown in FIG. 5B, therefore only the differences will be discussed herein. A first shield part 132a and a second shield part 134a are spaced a distance apart from each other. The first shield part 132a and the second shield part 134a are connected to each other similar to the contiguous configuration shown in FIG. 1B via a contiguous connecting path including a first segment 148a of the first shield part 132a, a sixth segment 164a of the second shield part 134, a fourth segment 156a of the second shield part 134, and the third segment 154 of the second shield part 134. A chamfered corner 147a is disposed between the first and fourth sides 140, 146.

The shield system 330 may comprise a single rectangular shield formed of the first and second layers 380, 382, or in the alternative, the shield system 330 could have multiple parts and shapes, such as described with respect to the shield system 130 shown and described in FIGS. 1-6B. In other words, composite layer shields may be used in place of the single layer shields shown in FIGS. 1-6B.

Though illustrated in an automotive transmission 10, 210, the shield systems 130, 330 could alternative be utilized in other powertrain systems, such as a transfer case, a rear drive module, or a power takeoff unit (PTU), by way of example. Furthermore, the shield systems 130, 330 may be used in an automatic or manual transmission.

The description of the invention is merely exemplary in nature and variations that do not depart from the gist of the invention are intended to be within the scope of the invention. Such variations are not to be regarded as a departure from the spirit and scope of the invention.

What is claimed is:

1. A linear magnetic sensor shield system comprising:
a sensor housing defining a U-shape having spaced apart parallel opposed parts interconnected by a housing member;
a first field sensor assembly positioned in a first one of the housing parts, the first field sensor assembly having a first side and a third side extending from the first side, the first field sensor assembly also including first and second field sensors spaced a distance apart from each other;
a second field sensor assembly positioned in a second one of the housing parts, the second field sensor assembly having a second side, the second field sensor assembly also including third and fourth field sensors spaced a distance apart from each other, the second field sensor assembly being disposed adjacent to the first field sensor assembly;
a shield system generally defining a U-shape and contacting an outer perimeter of the sensor housing, the shield system having a first shield part, a second shield part connected to the first shield part by a segment of the second shield part, the first shield part, the second shield part and the segment defining the U-shape, the shield system contacting the first and second field sensor assemblies, the shield system including the first shield part directly contacting the first side and the third side, and the second shield part directly contacting the second side.

2. The linear magnetic sensor shield system of claim 1, the second field sensor assembly having a fourth side extending from the second side, the second shield part also disposed adjacent to the fourth side.

3. The linear magnetic sensor shield system of claim 2, the fourth side being connected to the first side.

4. The linear magnetic sensor shield system of claim 3, wherein the second shield part also contacts the fourth side.

5. The linear magnetic sensor shield system of claim 3, wherein the first shield part has a first shield part first portion disposed adjacent to the first side, the first shield part having a first shield part second portion disposed adjacent to the third side, the first shield part first portion being generally planar, the first shield part second portion being generally planar, the first shield part second portion extending generally perpendicularly with respect to the first shield part first portion.

6. The linear magnetic sensor shield system of claim 5, wherein the second shield part has a second shield part first portion disposed adjacent to the second side, the second shield part having a second shield part second portion disposed adjacent to the fourth side, the second shield part first portion being generally planar, the second shield part second portion being generally planar, the second shield part second portion extending generally perpendicularly with respect to the second shield part first portion.

7. The linear magnetic sensor shield system of claim 6, wherein the second shield part first portion is unitarily formed with the second shield part second portion, and wherein the first shield part first portion is unitarily formed with the first shield part second portion.

8. The linear magnetic sensor shield system of claim 7, wherein the first and second shield parts comprise mu metal.

9. The linear magnetic sensor shield system of claim 8, wherein the first shield part first portion, the first shield part second portion, the second shield part first portion, and the second shield part second portion each have a thickness in the range of about 0.015 inch to about 0.030 inch.

10. The linear magnetic sensor shield system of claim 9, the first field sensor having a first magnetic core surrounded by a first coil, the second field sensor having a second magnetic core surrounded by a second coil, the third field sensor having a third magnetic core surrounded by a third coil, and the fourth field sensor having a fourth magnetic core surrounded by a fourth coil.

11. The linear magnetic sensor shield system of claim 10, further comprising a first piston having a first main body and a first permanent magnet attached to the first main body, the first piston configured to move in a linear direction and result in a linear displacement of the first piston, the first and second field sensors operable to sense the linear displacement of the first piston, the linear sensor shield system further comprising a first clutch assembly selectively engageable by the first piston, the linear sensor shield system further comprising a second piston having a second main body and a second permanent magnet attached to the second main body, the second piston configured to move in a linear direction and result in a linear displacement of the second piston, the third and fourth field sensors operable to sense the linear displacement of the second piston, the linear sensor shield system further comprising a second clutch assembly selectively engageable by the second piston.

12. A linear magnetic sensor shield system comprising:
a sensor housing defining a U-shape having spaced apart parallel opposed parts interconnected by a side;
a first field sensor assembly positioned in a first one of the housing parts, the first field sensor assembly having a first side, the first field sensor assembly also including first and second field sensors spaced a distance apart from each other;
a second field sensor assembly positioned in a second one of the housing parts, the second field sensor assembly having a second side, the second field sensor assembly also including third and fourth field sensors spaced a distance apart from each other, the second field sensor assembly being disposed adjacent to the first field sensor assembly; and
a shield system generally defining a U-shape and contacting an outer perimeter of the sensor housing, the shield system contacting the first and second field sensor assemblies, the shield system including a first shield part directly contacting the first side and a second shield part directly contacting the second side, the second shield part having a segment connected to the first shield part such that the first shield part, the second shield part and the segment define the U-shape, and wherein the first shield part has a thickness in the range of about 0.015 inch to about 0.030 inch, and the second shield part has a thickness in the range of about 0.015 inch to about 0.030 inch.

13. The linear magnetic sensor shield system of claim 12, wherein the first and second shield parts comprise mu metal.

14. The linear magnetic sensor shield system of claim 13, the first field sensor having a first magnetic core surrounded by a first coil, the second field sensor having a second magnetic core surrounded by a second coil, the third field sensor having a third magnetic core surrounded by a third coil, and the fourth field sensor having a fourth magnetic core surrounded by a fourth coil.

15. The linear magnetic sensor shield system of claim 14, further comprising a first piston having a first main body and a first permanent magnet attached to the first main body, the first piston configured to move in a linear direction and result in a linear displacement of the first piston, the first and second field sensors operable to sense the linear displacement of the first piston, the linear sensor shield system further comprising a first clutch assembly selectively engageable by the first piston, the linear sensor shield system further comprising a second piston having a second main body and a second permanent magnet attached to the second main body, the second piston configured to move in a linear direction and result in a linear displacement of the second piston, the third and fourth field sensors operable to sense the linear displacement of the second piston, the linear sensor shield system further comprising a second clutch assembly selectively engageable by the second piston.

16. A linear magnetic sensor shield system for use in an automobile, the linear sensor shield system comprising:
  a sensor housing defining a U-shape having spaced apart parallel opposed parts interconnected by a housing member;
  a first shield configured to be disposed adjacent to a first field sensor assembly positioned in a first one of the housing parts, the first shield having a first shield first portion and a first shield second portion, the first shield first portion being generally planar, the first shield second portion being generally planar, the first shield second portion being disposed generally perpendicularly with respect to the first shield first portion, the first shield first portion and the first shield second portion being unitarily formed with each other; and
  a second shield together with the first shield defining a U-shape, the second shield connected to the first shield by a segment of the second shield, the first shield, the second shield and the segment defining the U-shape, the second shield configured to be disposed adjacent to a second field sensor assembly, the second field sensor assembly positioned in a second one of the housing parts, the second shield having a second shield first portion and a second shield second portion, the second shield first portion being generally planar, the second shield second portion being generally planar, the second shield second portion being disposed generally perpendicularly with respect to the second shield first portion, the second shield first portion and the second shield second portion being unitarily formed with each other, the first and second shields being disposed a distance apart from each other.

17. The linear magnetic sensor shield system of claim 16, wherein the first shield and the second shield each comprise of mu metal, each of the first shield first portion, the first shield second portion, the second shield first portion, and the second shield second portion have a thickness in the range of about 0.015 inch and about 0.030 inch.

18. A torque transmitting device for an automotive transmission, the torque transmitting device comprising:
  an input member;
  a first input shaft having a first shaft magnetic permeability;
  a second input shaft having a second shaft magnetic permeability;
  a first clutch assembly selectively connecting the first input shaft with the input member;
  a second clutch assembly selectively connecting the second input shaft with the input member;
  a first actuating member having a first main body and a first permanent magnet attached to the first main body, the first actuating member configured to move in a linear direction to actuate the first clutch assembly to connect the input member to the first input shaft;
  a second actuating member having a second main body and a second permanent magnet attached to the second main body, the second actuating member configured to move in a linear direction to actuate the second clutch assembly to connect the input member to the second input shaft; and
  a sensor system comprising:
    a sensor housing defining a U-shape having spaced apart parallel opposed parts interconnected by a housing member;
    a first field sensor assembly positioned in a first one of the housing parts, the first field sensor assembly having a first side and a third side disposed adjacent to the first side, the first field sensor assembly including first and second field sensors spaced a distance apart from each other, the first and second field sensors being disposed in the first one of the housing parts;
    a second field sensor assembly positioned in a second one of the housing parts, the second field sensor assembly having a second side, the second field sensor assembly including third and fourth field sensors spaced a distance apart from each other, the third and fourth field sensors being disposed in the second assembly housing, the second field sensor assembly being disposed adjacent to the first field sensor assembly; and
    a shield system generally defining a U-shape and contacting an outer perimeter of the sensor housing, the shield system disposed adjacent to the first and second field sensor assemblies, the shield system including a first shield part disposed adjacent to the first side and the third side, and a second shield part connected to the first shield part by a segment of the second shield part, the first shield part, the second shield part and the segment defining the U-shape, the second shield part disposed adjacent to the second side.

19. The torque transmitting device of claim 18, wherein the first and second shield parts comprise mu metal, and wherein the first shield part and the second shield part each have a thickness in the range of about 0.015 inch to about 0.030 inch.

* * * * *